United States Patent
Van Dijsseldonk et al.

(10) Patent No.: US 9,523,921 B2
(45) Date of Patent: Dec. 20, 2016

(54) EUV RADIATION SYSTEM AND LITHOGRAPHIC APPARATUS

(75) Inventors: Antonius Johannes Josephus Van Dijsseldonk, Hapert (NL); Erik Roelof Loopstra, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 851 days.

(21) Appl. No.: 13/390,290

(22) PCT Filed: Jul. 14, 2010

(86) PCT No.: PCT/EP2010/060145
§ 371 (c)(1),
(2), (4) Date: Feb. 13, 2012

(87) PCT Pub. No.: WO2011/018295
PCT Pub. Date: Feb. 17, 2011

(65) Prior Publication Data
US 2012/0147349 A1 Jun. 14, 2012

Related U.S. Application Data

(60) Provisional application No. 61/234,061, filed on Aug. 14, 2009, provisional application No. 61/285,556, filed on Dec. 11, 2009.

(51) Int. Cl.
*G03B 27/54* (2006.01)
*G03F 7/20* (2006.01)
*H05G 2/00* (2006.01)

(52) U.S. Cl.
CPC .......... *G03F 7/70033* (2013.01); *H05G 2/003* (2013.01)

(58) Field of Classification Search
CPC .. G03F 7/70025; G03F 7/70033; H05G 2/003; H05G 2/005; H05G 2/006; H05G 2/008
(Continued)

(56) References Cited

U.S. PATENT DOCUMENTS 3,674,334 A * 7/1972 Offner ................ G02B 17/0626
359/366
5,063,586 A * 11/1991 Jewell et al. .................. 378/34
(Continued)

FOREIGN PATENT DOCUMENTS

EP 0422853 A2 4/1991
JP 10-204620 8/1998
(Continued)

OTHER PUBLICATIONS

Japanese Office Action mailed Aug. 22, 2013 in corresponding Japanese Patent Application No. 2011-524216.
(Continued)

*Primary Examiner* — Christina Riddle
(74) *Attorney, Agent, or Firm* — Pillsbury Winthrop Shaw Pittman LLP

(57) ABSTRACT

A lithographic projection apparatus is provided with a EUV radiation system that includes a source chamber, a supply constructed and arranged to supply a target material to a predetermined plasma formation position, an optical system formed by three or more mirrors arranged to establish a beam path extending to the target material when the target material is located at the predetermined plasma formation position, and a laser system constructed and arranged to provide a laser beam along the beam path for interaction with the target material to produce an EUV radiation-emitting plasma inside the chamber.

15 Claims, 3 Drawing Sheets

(58) Field of Classification Search
USPC ......... 355/52, 53, 55, 67–71, 77; 250/492.1, 250/492.2, 493.1, 548, 504 R; 313/231.31; 315/11.21, 111.41; 378/34, 378/119
See application file for complete search history.

(56) References Cited

U.S. PATENT DOCUMENTS

| | | | |
|---|---|---|---|
| 6,031,598 A * | 2/2000 | Tichenor et al. | 355/67 |
| 6,236,033 B1 | 5/2001 | Ebbesen et al. | |
| 6,487,003 B1 * | 11/2002 | Suzuki et al. | 359/326 |
| 7,250,621 B2 * | 7/2007 | Gaebel et al. | 250/504 R |
| 7,453,645 B2 | 11/2008 | Klunder et al. | |
| 7,817,246 B2 | 10/2010 | Mickan et al. | |
| 8,256,441 B2 | 9/2012 | Moriya et al. | |
| 8,766,212 B2 | 7/2014 | Frijns | |
| 2006/0219957 A1 * | 10/2006 | Ershov et al. | 250/504 R |
| 2007/0029289 A1 | 2/2007 | Brown | |
| 2008/0087847 A1 * | 4/2008 | Bykanov et al. | 250/504 R |
| 2009/0091753 A1 * | 4/2009 | Beardsley et al. | 356/305 |
| 2009/0316146 A1 * | 12/2009 | Beardsley et al. | 356/303 |
| 2010/0171049 A1 * | 7/2010 | Moriya et al. | 250/504 R |
| 2010/0258750 A1 * | 10/2010 | Partlo et al. | 250/504 R |
| 2010/0327192 A1 * | 12/2010 | Fomenkov | G03F 7/70033 250/504 R |

FOREIGN PATENT DOCUMENTS

| | | |
|---|---|---|
| JP | 2004-70288 | 3/2004 |
| JP | 2004-103773 | 4/2004 |
| JP | 2006-191090 | 7/2006 |
| JP | 2008-532232 | 8/2008 |
| JP | 2008-277529 | 11/2008 |
| TW | 200807181 | 2/2008 |
| TW | 200811906 | 3/2008 |
| WO | 2006/093783 | 9/2006 |

OTHER PUBLICATIONS

International Search Report for PCT International Patent Application No. PCT/EP2010/060145, mailed on Nov. 9, 2010.

* cited by examiner

EUV RADIATION SYSTEM AND LITHOGRAPHIC APPARATUS

CROSS-REFERENCE TO RELATED APPLICATIONS

This application is the U.S. National Phase entry of International Patent Application No. PCT/EP2010/060145, filed Jul. 14, 2010, which claims the benefit of priority from U.S. provisional application no. 61/234,061 which was filed on 14 Aug. 2009 and U.S. provisional application no. 61/285,556 which was filed on 11 Dec. 2009, all of which are incorporated herein in their entireties by reference.

FIELD

The present invention relates to an extreme ultraviolet ("EUV") radiation system and a lithographic projection apparatus comprising such an EUV radiation system.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture $NA_{PS}$, or by decreasing the value of $k_1$.

In order to shorten the exposure wavelength and, thus, reduce the minimum printable size, it has been proposed to use an extreme ultraviolet (EUV) radiation system. EUV radiation is electromagnetic radiation having a wavelength within the range of 10-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles or droplets of a suitable material (e.g. tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LLP) source.

The plasma is typically produced in a sealed vessel, e.g., vacuum chamber, in this document also referred to as plasma chamber, and monitored using various types of metrology equipment. In addition to generating EUV radiation, these plasma processes also typically generate undesirable by-products in the plasma chamber which can include out-of-band radiation, high energy ions and debris, e.g., atoms and/or clumps/microdroplets of the target material.

These plasma formation by-products can potentially heat, damage or reduce the operational efficiency of the various plasma chamber optical elements including, but not limited to, collector mirrors including multi-layer mirrors (MLM's) capable of EUV reflection at normal incidence and/or grazing incidence, the surfaces of metrology detectors, windows used to image the plasma formation process, and the laser input window. The heat, high energy ions and/or debris may be damaging to the optical elements in a number of ways, including coating them with materials which reduce light transmission, penetrating into them and possibly damaging structural integrity and/or optical properties, such as the ability of a mirror to reflect light at such short wavelengths, corroding or eroding them and/or diffusing into them. For some target materials, e.g., tin, it may be desirable to introduce an etchant, e.g., HBr, into the plasma chamber to etch material, e.g. debris that has deposited on the optical elements. It is further contemplated that the affected surfaces of the elements may be heated to increase the reaction rate of the etchant.

As indicated above, one technique to produce EUV light involves irradiating a target material. In this regard, $CO_2$ lasers, e.g., outputting light at 10.6 μm wavelength, may present certain advantages as a drive laser irradiating the target material in a laser-produced plasma (LPP) process. This may be especially true for certain target materials, e.g., materials containing tin. For example, one potential advantage may include the ability to produce a relatively high conversion efficiency between the drive laser input power and the output EUV power. Another potential advantage of $CO_2$ drive lasers may include the ability of the relatively long wavelength light (for example, as compared to deep UV at 198 nm) to reflect from relatively rough surfaces such as a reflective optic that has been coated with tin debris. This property of 10.6 μm radiation may allow reflective mirrors to be employed near the plasma for, for example, steering, focusing and/or adjusting the focal power of the drive laser beam. However, for 10.6 µm drive lasers, the window inputting the laser into the plasma chamber is typically made of ZnSe and coated with an anti-reflection coating. Unfortunately, these materials may be sensitive to certain etchants, e.g., bromides.

In addition to the challenges presented by plasma generated debris, conventional laser-produced plasma sources use both mirrors and lenses to focus the laser beam on the target material. The lenses may cause a considerable amount of back reflections. Also the laser beam may have a power of about 10 kW and in some cases even higher. This may cause the lenses to heat and, possibly, to deform, which may reduce the quality of the heated lenses. Although it has been suggested to use antireflective coatings on the lenses in order to reduce the back reflections, these coatings may increase absorption of the radiation and thus may cause the lenses to be heated even more.

SUMMARY

It is desirable to decrease back reflection of optics focusing the laser beam on the target material, desirably while maintaining the optics at an acceptable temperature.

According to an aspect of the present invention, there is provided an EUV radiation system comprising: a source chamber; a supply constructed and arranged to supply a target material to a predetermined plasma formation position; an optical system formed by three or more mirrors arranged to establish a beam path extending to the target material when the target material is located at the predetermined plasma formation position; and a laser system constructed and arranged to provide a laser beam along the beam path for interaction with the target material to produce an EUV radiation-emitting plasma inside the chamber.

At least one of the mirrors or even all of the mirrors may be located outside the source chamber. The source chamber may have a window through which the beam path extends, the window not being perpendicular to the beam path. Such a window may, for example, be tilted to the beam path at an angle such that any radiation reflected by the window does not return through the optical system. The laser system may be constructed to at least generate radiation having a wavelength selected from a wavelength range of about 9 µm to about 11 µm. This wavelength may be about 9.4 µm or about 10.6 µm.

According to an aspect of the invention, there is provided an EUV radiation system comprising: a source chamber; a supply constructed and arranged to supply a target material to a predetermined plasma formation position; an optical system formed by three or more mirrors arranged to establish a beam path extending to the predetermined plasma formation position; and a laser system constructed and arranged to provide a laser beam along the beam path for interaction with the target material at the predetermined plasma formation position to produce an EUV radiation-emitting plasma inside the chamber.

According to an aspect of the invention, there is provided a lithographic projection apparatus provided with an EUV radiation system including a source chamber, a supply constructed and arranged to supply a target material to a predetermined plasma formation position, an optical system formed by three or more mirrors arranged to establish a beam path extending to the target material when the target material is located at the predetermined plasma formation position, and a laser system constructed and arranged to provide a laser beam along the beam path for interaction with the target material to produce an EUV radiation emitting plasma inside the chamber.

According to an aspect of the invention, there is provided a lithographic projection apparatus provided with an EUV radiation system including a source chamber, a supply constructed and arranged to supply a target material to a predetermined plasma formation position, an optical system formed by three or more mirrors arranged to establish a beam path extending to the target material when the target material is located at the predetermined plasma formation position, and a laser system constructed and arranged to provide a laser beam along the beam path for interaction with the target material to produce an EUV radiation-emitting plasma inside the chamber. The lithographic projection apparatus further includes an illumination system configured to condition the EUV radiation emitted by the plasma, a support structure constructed to hold a patterning device, the patterning device being capable of imparting the radiation beam with a pattern in its cross-section to form a patterned radiation beam, and a projection system configured to project the patterned radiation beam onto a target portion of a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
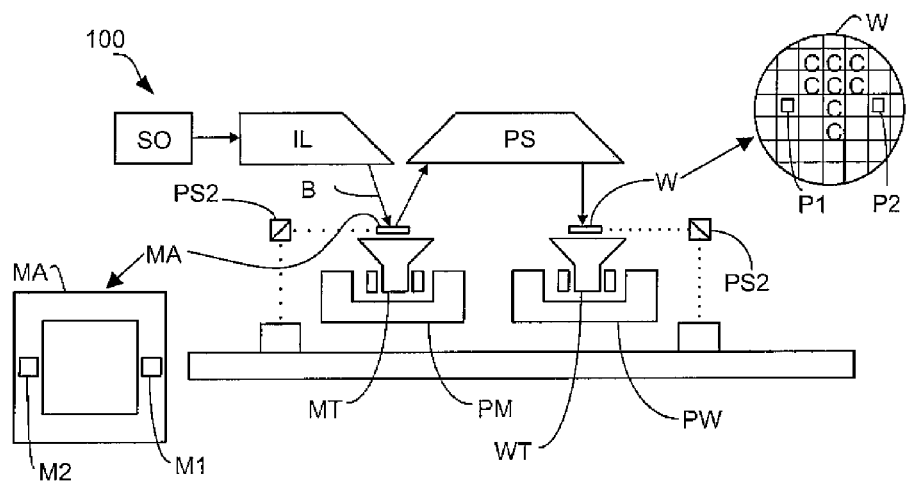
FIG. 1 depicts a lithographic apparatus according to an embodiment of the present invention.

FIG. 1 schematically depicts a lithographic apparatus 100 according to an embodiment of the invention. The apparatus comprises an illumination system (illuminator) IL configured to condition a radiation beam B (of EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection lens system) PS configured to project a pattern imparted to the radiation beam B by patterning device MA onto a target portion C (e.g. comprising one or more dies) of the substrate W.

The illumination system may include various types of optical components for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" may encompass any type of projection system, as appropriate for the exposure radiation being used, or for other factors such as the use of a vacuum. It may be desired to use a vacuum for EUV since gases may absorb too much radiation. A vacuum environment may therefore be provided to the whole beam path with the aid of a vacuum wall and vacuum pumps.

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LLP") the required plasma can be produced by irradiating a fuel, such as a droplet, stream or cluster of material having the required line-emitting element, with a laser beam. The source collector module SO may be part of an EUV radiation system including a laser not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
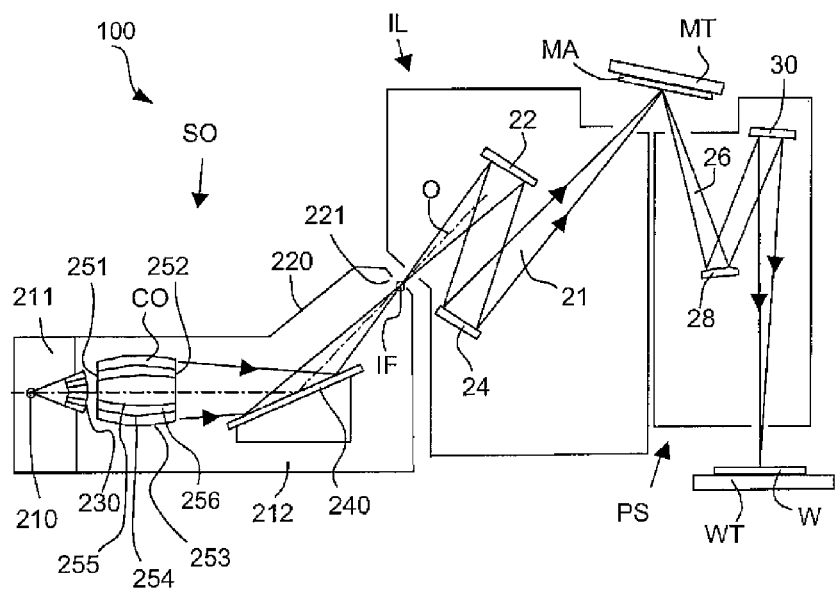
FIG. 2 depicts a more detailed schematic view of an embodiment of the lithographic apparatus of FIG. 1.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 may be created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present depending upon the type of lithographic apparatus. Further, there may be more mirrors present than those shown in the Figures, for example there may be 1-6 additional reflective elements present in the projection system PS than shown in FIG. 2.

Collector optic CO, is depicted as a nested collector with reflectors 253, 254, and 255, just as an example of a grazing incidence collector (or grazing incidence collector mirror). However, instead of a radiation collector 50 including a grazing incidence mirror, a radiation collector including a normal incidence collector may be applied. Hence, where applicable, collector optic CO as grazing incidence collector may also be interpreted as collector in general.

Further, instead of a grating 240, as schematically depicted in FIG. 2, also a transmissive optical filter may be applied. Optical filters transmissive for EUV and less transmissive for or even substantially absorbing UV radiation are known in the art. Hence, "grating spectral purity filter" is herein further indicated as "spectral purity filter" which includes gratings or transmissive filters. Not depicted in schematic FIG. 2, but also included as optional optical element may be EUV transmissive optical filters, for instance arranged upstream of collector optic CO, or optical EUV transmissive filters in illumination system IL and/or projection system PS.

The collector optic CO is usually placed in the vicinity of the source SO or an image of the source SO. Each reflector 253, 254, 255 may include at least two adjacent reflecting surfaces, the reflecting surfaces further from the source SO being placed at smaller angles to the optical axis O than the reflecting surface that is closer to the source SO. In this way, a grazing incidence collector CO is configured to generate a beam of (E)UV radiation propagating along the optical axis O. At least two reflectors may be placed substantially coaxially and extend substantially rotationally symmetric about the optical axis O. It should be appreciated that collector CO may have further features on the external surface of outer reflector 255 or further features around outer reflector 255. For example, a further feature may be a protective holder, or a heater. Reference number 256 indicates a space between two reflectors, e.g. between reflectors 254 and 255. Each reflector 253, 254, 255 may include at least two adjacent reflecting surfaces, the reflecting surfaces further from the source SO being placed at smaller angles to the optical axis O than the reflecting surface that is closer to the source SO. In this way, a grazing incidence collector CO is configured to generate a beam of (E)UV radiation propagating along the optical axis O. At least two reflectors may be placed substantially coaxially and extend substantially rotationally symmetric about the optical axis O.

During use, on one or more of the outer reflectors 253 and inner reflectors 254 and 255 deposition may be found. The collector CO may be deteriorated by such deposition (deterioration by debris, e.g. ions, electrons, clusters, droplets, electrode corrosion from the source SO). Deposition of Sn, for example due to a Sn source, may, after a few monolayers, be detrimental to reflection of the collector CO or other optical elements, which may necessitate the cleaning of such optical elements.

Figure 3:
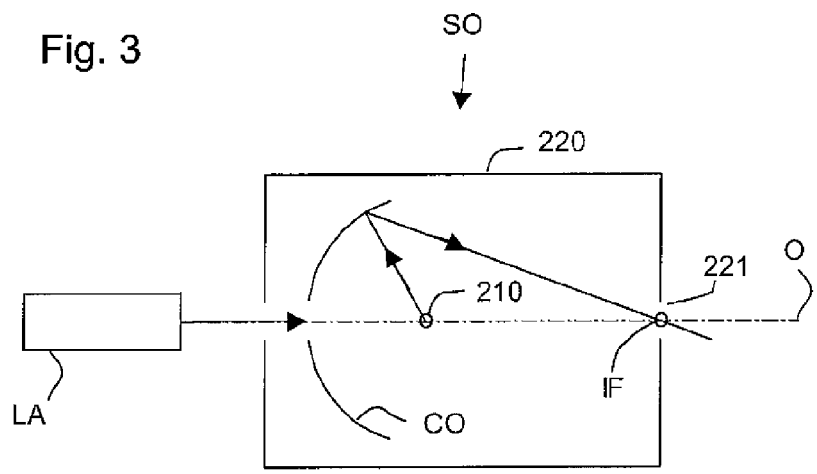
FIG. 3 is a more detailed view of a source collector module of the lithographic apparatus of FIGS. 1 and 2.
Figure 4:
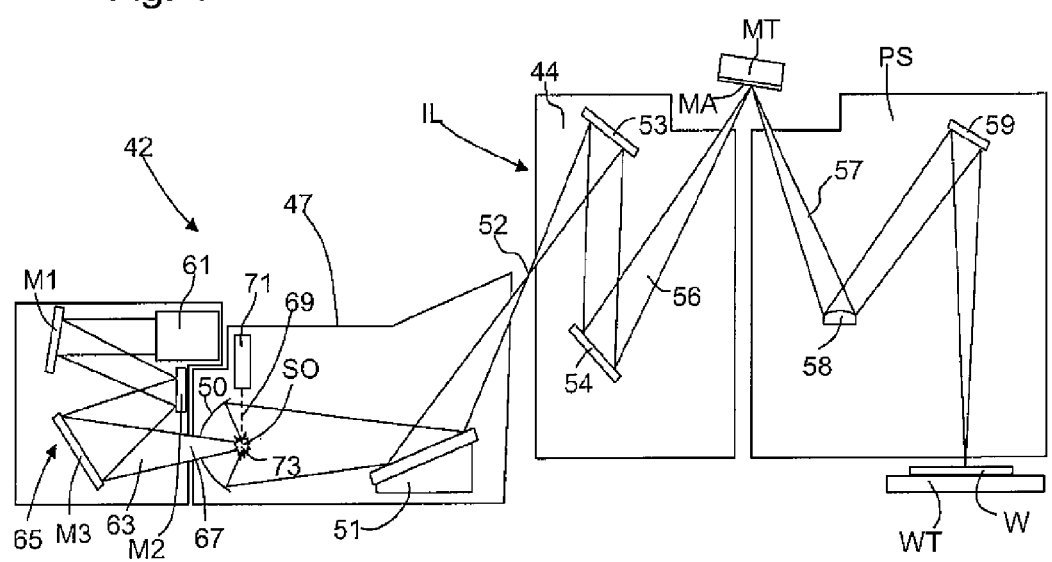
FIG. 4 depicts a more detailed schematic view of an embodiment of the lithographic apparatus of FIG. 1.

FIG. 4 shows another embodiment of the projection apparatus in detail. The illumination system IL and the projection system PS are very similar to the illumination system IL and the projection system PS of the projection apparatus of FIG. 2. However, the radiation system 42 uses a laser-produced plasma as a radiation source SO. The radiation system 42 comprises a source chamber 47, in this embodiment not only substantially enclosing the source SO, but also the collector mirror 50 which, in the embodiment of FIG. 3, is a normal-incidence collector 50, for instance a multi-layer mirror.

Also, the radiation system 42 is typically provided with a laser system 61 constructed and arranged to provide a laser beam 63 which is reflected by an optical system 65 through aperture 67 provided in the collector mirror 50. The laser system 61 may be a $CO_2$ laser. The laser system may be constructed to at least generate radiation having a wavelength selected from a wavelength range of about 9 μm to about 11 μm, especially a wavelength of about 9.4 μm or about 10.6 μm. Additionally or alternatively, the laser may be a pulsed laser. The laser beam 63 of the $CO_2$ laser typically has a power of about 10 kW or more.

The radiation system includes a target material 69, such as Sn or Xe, in a target material supply 71. The target material supply 71 is constructed and arranged to supply the target material 69 to a predetermined plasma position 73. The optical system 65—in this embodiment a three-mirror system formed by three mirrors M1, M2 and M3, having respective reflective surfaces 51, S2 and S3 (see FIG. 5)—is arranged to establish a beam path extending to the predetermined plasma position 73 so that the beam path extends to a droplet of the target material 69 when the droplet is located at the predetermined plasma position 73, typically coinciding with a focal point of the optical system 65. The laser system is arranged such that the laser beam 63 is provided along the beam path for interaction with the target material to produce an EUV-emitting plasma inside the source chamber 47 at the predetermined plasma position 73.

Figure 5:
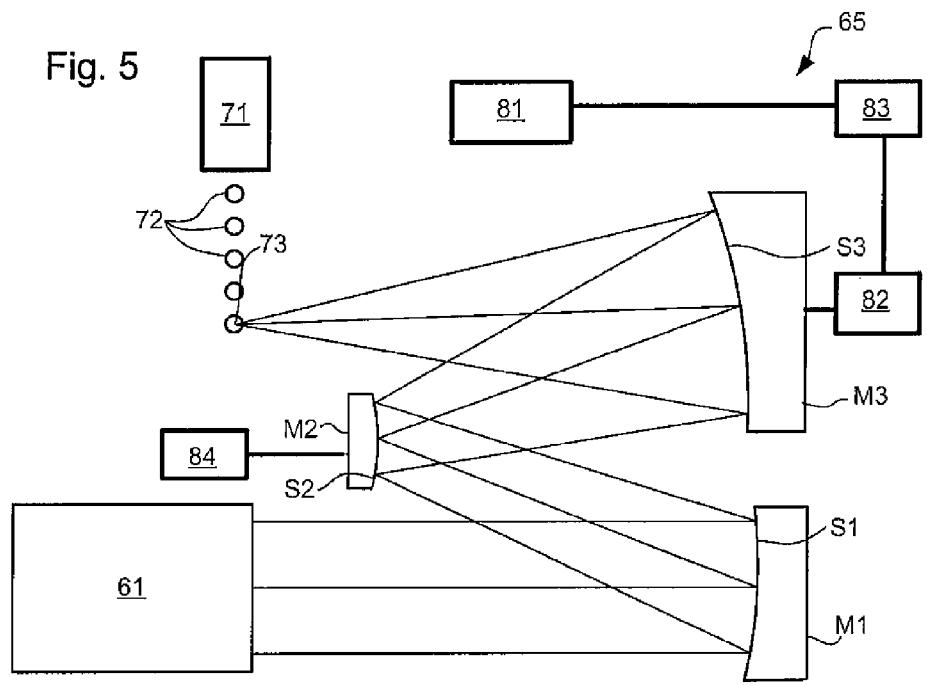
FIG. 5 depicts a detailed schematic view of an embodiment of a laser system of the lithographic apparatus of FIG. 3.

In FIG. 5 it can be seen that the optical system 65 is a type commonly known as a "three-mirror anastigmat". Generally, the term "anastigmat" refers to an optical system that has no, or substantially no, astigmatism. In the present invention it is not required that the optical system has no astigmatism. Rather it is desirable that the laser beam 63 is concentrated to a volume that coincides with the target material at the plasma production position. The power of the beam should be concentrated in a volume comparable to or smaller than the size of the target material particles or droplets. If the beam focus is larger, there will be a loss of efficiency which is desirably minimized. The use of three aspherical mirrors allows an optical system of the device performance to be constructed economically and minimizes transmission losses. Because the optical system 65 is formed by mirrors, the necessity of any lenses within the beam path through which the laser beam 63 extends is obviated, thus making possible that there are no lenses along the beam path. Any back reflections usually caused by lenses are thus avoided as well as lens heating. Appropriate application of the invention will also avoid heating of anti-reflective coatings.

In an embodiment, surfaces S1, S2, S3 of mirrors M1, M2, M3 are off-axis sections of rotationally symmetric conic surfaces. Optical system 65 may have a single axis of symmetry. Mirrors M1 and M3 may be substantially coplanar.

One of the mirrors M1, M2 and M3 of the optical system 65, preferably mirror M3 which is the furthest downstream in the beam path may further be mounted so as to be rotatable with respect to the rest of the optical system 65 in order to be able to shift the location of the focal point. In an embodiment, the rotatable mirror, e.g. mirror M3, is adjusted during calibration and/or maintenance of the apparatus to set the focal point of the optical system to a predetermined point. In another embodiment, the rotatable mirror is adjustable dynamically during operation to ensure that the beam is incident on the target material. In this embodiment a sensor 81 senses the position of particles or droplets of target material 72. An actuator 82 drives the mirror M3 to adjust the position of the focal point to coincide with a particle or droplet of target material 72. The actuator 82 is controlled by a controller 83 which is responsive to the position sensed by the sensor 81.

In operation, the target material 69 is supplied by the target material supply 71 in the form of droplets 72. When such a droplet of the target material 69 reaches the predetermined plasma formation position 73, the laser beam 63 impinges on the droplet 69 and an EUV radiation-emitting plasma forms inside the source chamber 47. In this embodiment of FIG. 4, EUV radiation emitted from the predetermined plasma formation position 73 is focused by the normal-incidence collector mirror and, optionally, via the reflective spectral grating filter 51 onto the intermediate focus point 52.

To avoid excessive heating one or more of the reflective surfaces S1, S2 and S3 may be provided with a coating, for instance a gold-containing coating. In an embodiment, the coating is substantially formed of gold. In an embodiment, one or more of the mirrors of optical system 65 is provided with a cooling system 84 to cool it during operation. Cooling system 84 may be an active cooling system, e.g. in which a cooling medium is circulated between the mirror and an external heat exchanger, or a passive cooling system such as a heat pipe or a radiator.

In an embodiment, one or more additional mirrors is provided in the optical system. For example, a flat folding mirror may be provided to enable a more convenient layout.

Figure 6:
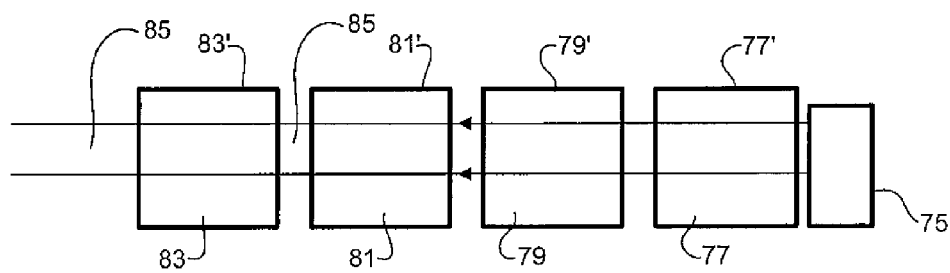
FIG. 6 depicts a detailed schematic view of an embodiment of the laser system of the lithographic apparatus of FIG. 3.

In FIG. 6, a laser system 61 that may be used in the EUV radiation system 42 is schematically depicted. The laser system of FIG. 6 comprises a seed laser 75 and four optical gain media 77, 79, 81 and 83 configured to produce an amplified photon beam 85 forming the laser beam 63. At least one of the optical gain media 77, 79, 81 and 83 may be contained in a chamber having a window constructed and arranged to transmit the amplified photon beam 85. In the laser system of FIG. 5, all of the optical gain media 77, 79, 81 and 83 are contained in chambers 77', 79', 81' and 83' respectively, each chamber having windows arranged to transmit the amplified photon beam. Such windows may be present along in the amplified photon beam, but also in the beam path along which the laser beam 63 is transmitted, for instance in a wall of the source chamber 47 and/or in a wall containing the optical system 65. Such walls are preferably tilted with respect to the amplified photon beam or laser beam in such a way that disadvantages caused by back reflection are minimized. The amplified photon beam 85 transmitted through one of the windows of the chamber 83' forms the laser beam 63 and is directly incident on the mirror M1 of the optical system 65. If the optical gain media 77, 79, 81 and 83 are not contained in a chamber, the amplified photon beam 85 produced by the optical gain media is directly incident on the mirror M1 of the optical system 65.

Although specific reference may have been made above to the use of embodiments of the invention in the context of optical lithography, it will be appreciated that the invention may be used in other applications, for example imprint lithography, and where the context allows, is not limited to optical lithography.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An EUV radiation system comprising:
   a source chamber;
   a supply constructed and arranged to supply a target material to a predetermined plasma formation position;
   an optical system formed by three or more mirrors arranged to establish a beam path extending to the target material when the target material is located at the predetermined plasma formation position, wherein three of said mirrors form a three-mirror anastigmat constructed and arranged to at least reduce an amount of astigmatism in a focal point of the optical system, and wherein reflective surfaces of the three of said mirrors are off-axis sections of rotationally symmetric conic surfaces; and
   a laser system constructed and arranged to provide a laser beam along the beam path such that the laser beam is focused by a final one of the mirrors at the predetermined plasma formation position for interaction with the target material to produce an EUV radiation-emitting plasma inside the chamber.

2. An EUV radiation system according to claim 1, wherein one or more of the mirrors is rotatable in order to shift the location of the focal point.

3. An EUV radiation system according to claim 2, further comprising a sensor configured to sense the position of the target material and a controller configured to control an actuator attached to the one or more rotatable mirrors in response to the position of the target material as sensed by the sensor.

4. An EUV radiation system according to claim 2, wherein the mirror that is last on the beam path is rotatable.

5. An EUV radiation system according to claim 2, wherein the focal point substantially coincides with the predetermined plasma formation position.

6. An EUV radiation system according to claim 1, wherein at least one of the reflective surfaces is provided with a coating.

7. An EUV radiation system according to claim 6, wherein the coating contains gold or is substantially formed by gold.

8. An EUV radiation system according to claim 1, wherein at least one of the mirrors is located outside the source chamber.

9. An EUV radiation system according to claim 1, wherein the laser system comprises one or more optical gain media configured to produce an amplified photon beam forming the laser beam, and wherein the amplified photon beam is directly incident on a first mirror of the optical system.

10. An EUV radiation system according to claim 1, wherein the laser system comprises one or more optical gain media configured to produce an amplified photon beam forming the laser beam, wherein at least one of the optical gain media is contained in a second chamber having a window constructed and arranged to transmit the amplified photon beam, and wherein the amplified photon beam transmitted through the window is directly incident on a first mirror of the optical system.

11. An EUV radiation system comprising:
    a source chamber;
    a supply constructed and arranged to supply a target material to a predetermined plasma formation position;
    an optical system formed by three or more mirrors arranged to establish a beam path extending to the predetermined plasma formation position, wherein three of said mirrors form a three-mirror anastigmat constructed and arranged to at least reduce an amount of astigmatism in a focal point of the optical system, and wherein reflective surfaces of the three of said mirrors are off-axis sections of rotationally symmetric conic surfaces; and
    a laser system constructed and arranged to provide a laser beam along the beam path such that the laser beam is focused by a final one of the mirrors at the predetermined plasma formation position for interaction with the target material at the predetermined plasma formation position to produce an EUV radiation-emitting plasma inside the chamber.

12. A lithographic projection apparatus provided with an EUV radiation system comprising:
    a source chamber;
    a supply constructed and arranged to supply a target material to a predetermined plasma formation position;
    an optical system formed by three or more mirrors arranged to establish a beam path extending to the target material when the target material is located at the predetermined plasma formation position, wherein three of said mirrors form a three-mirror anastigmat constructed and arranged to at least reduce an amount of astigmatism in a focal point of the optical system, and wherein reflective surfaces of the three of said mirrors are off-axis sections of rotationally symmetric conic surfaces; and
    a laser system constructed and arranged to provide a laser beam along the beam path such that the laser beam is focused b a final one of the as .herical mirrors at the lasma formation position for interaction with the target material to produce an EUV radiation-emitting plasma inside the chamber.

13. A lithographic projection apparatus provided with an EUV radiation system comprising:
    a source chamber;
    a supply constructed and arranged to supply a target material to a predetermined plasma formation position;
    an optical system formed by three or more mirrors arranged to establish a beam path extending to the target material when the target material is located at the predetermined plasma formation position, wherein three of said mirrors form a three-mirror anastigmat constructed and arranged to at least reduce an amount of astigmatism in a focal point of the optical system, and wherein reflective surfaces of the three of said mirrors are off-axis sections of rotationally symmetric conic surfaces; and
    a laser system constructed and arranged to provide a laser beam along the beam path such that the laser beam is focused by a final one of the mirrors at the predetermined plasma formation position for interaction with the target material to produce an EUV radiation-emitting plasma inside the chamber.

14. A lithographic projection apparatus provided with an EUV radiation system comprising:
    a source chamber;
    a supply constructed and arranged to supply a target material to a predetermined plasma formation position;
    an optical system formed by three or more mirrors arranged to establish a beam path extending to the predetermined plasma formation position, wherein three of said mirrors form a three-mirror anastigmat constructed and arranged to at least reduce an amount of astigmatism in a focal point of the optical system, and wherein reflective surfaces of the three of said mirrors are off-axis sections of rotationally symmetric conic surfaces; and a laser system constructed and arranged to provide a laser beam along the beam path such that laser beam is focused by a final one of the mirrors at the predetermined plasma formation position for interaction with the target material at the predetermined plasma formation position to produce an EUV radiation-emitting plasma inside the chamber.

15. A lithographic projection apparatus according to claim 14, wherein the lithographic projection apparatus further comprises
an illumination system configured to condition the EUV radiation emitted by the plasma;
a support structure constructed to hold a patterning device, the patterning device being capable of imparting the radiation beam with a pattern in its cross-section to form a patterned radiation beam; and
a projection system configured to project the patterned radiation beam onto a target portion of a substrate.

* * * * *